US009768326B1

(12) United States Patent
Stan et al.

(10) Patent No.: US 9,768,326 B1
(45) Date of Patent: Sep. 19, 2017

(54) FABRICATION OF SOLAR CELLS WITH ELECTRICALLY CONDUCTIVE POLYIMIDE ADHESIVE

(71) Applicant: SolAero Technologies Corp., Albuquerque, NM (US)

(72) Inventors: Mark A. Stan, Albuquerque, NM (US); Chelsea Mackos, Albuquerque, NM (US); Jeff Steinfeldt, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 108 days.

(21) Appl. No.: 14/940,555

(22) Filed: Nov. 13, 2015

Related U.S. Application Data

(63) Continuation-in-part of application No. 13/961,354, filed on Aug. 7, 2013, now Pat. No. 9,214,594.

(51) Int. Cl.
*H01L 31/02* (2006.01)
*H01L 31/0725* (2012.01)
*H01L 31/048* (2014.01)

(52) U.S. Cl.
CPC ...... *H01L 31/02008* (2013.01); *H01L 31/048* (2013.01); *H01L 31/0725* (2013.01)

(58) Field of Classification Search
None
See application file for complete search history.

(56) References Cited

U.S. PATENT DOCUMENTS

| 5,182,420 | A | 1/1993 | Steitz et al. |
|---|---|---|---|
| 5,563,422 | A | 10/1996 | Nakamura et al. |
| 6,242,761 | B1 | 6/2001 | Fujimoto et al. |
| 6,402,792 | B1 | 6/2002 | Hiratsuka et al. |
| 6,951,819 | B2 | 10/2005 | Iles et al. |
| 7,727,795 | B2 | 6/2010 | Stan et al. |
| 7,741,146 | B2 | 6/2010 | Cornfeld et al. |
| 7,785,989 | B2 | 8/2010 | Sharps et al. |
| 7,960,201 | B2 | 6/2011 | Cornfeld et al. |
| 8,236,600 | B2 | 8/2012 | Cornfeld |
| 8,263,853 | B2 | 9/2012 | Varghese |
| 9,018,519 | B1 | 4/2015 | Cornfeld et al. |
| 2002/0062858 | A1 | 5/2002 | Mowles |
| 2005/0145832 | A1 | 7/2005 | Wessling et al. |
| 2006/0027802 | A1 | 2/2006 | Forrest et al. |
| 2008/0178932 | A1 | 7/2008 | Den Boer et al. |
| 2008/0289682 | A1* | 11/2008 | Adriani ............... H01L 31/048 136/251 |
| 2009/0078309 | A1 | 3/2009 | Cornfeld et al. |

(Continued)

OTHER PUBLICATIONS

U.S. Appl. No. 14/934,262, filed Nov. 6, 2016, Stan et al.

(Continued)

*Primary Examiner* — Michelle Mandala

(57) ABSTRACT

The present disclosure provides a method of manufacturing a solar cell comprising: providing a semiconductor growth substrate; depositing on said growth substrate a sequence of layers of semiconductor material forming a solar cell; applying a metal contact layer over said sequence of layers; and affixing the surface of a permanent supporting substrate composed of a carbon fiber reinforced polymer utilizing a conductive polyimide binding resin directly over said metal contact layer and permanently bonding it thereto by a thermocompressive technique.

18 Claims, 10 Drawing Sheets

(56) References Cited

U.S. PATENT DOCUMENTS

| | | | |
|---|---|---|---|
| 2009/0078310 A1 | 3/2009 | Stan et al. | |
| 2009/0229662 A1 | 9/2009 | Stan et al. | |
| 2009/0272430 A1 | 11/2009 | Cornfeld et al. | |
| 2009/0272438 A1 | 11/2009 | Cornfeld | |
| 2010/0012175 A1 | 1/2010 | Varghese et al. | |
| 2010/0122724 A1 | 5/2010 | Cornfeld et al. | |
| 2010/0203730 A1 | 8/2010 | Cornfeld et al. | |
| 2012/0255603 A1* | 10/2012 | Yu | H01L 31/0236 136/256 |
| 2012/0273823 A1 | 11/2012 | Yoneda et al. | |
| 2013/0112256 A1* | 5/2013 | Yu | H01L 31/02168 136/256 |
| 2013/0139871 A1 | 6/2013 | Hirata et al. | |
| 2014/0116500 A1 | 5/2014 | Stan et al. | |
| 2015/0040971 A1 | 2/2015 | Stan et al. | |

OTHER PUBLICATIONS

Aiken et al. "Consideration of High Bandgap Subcells for Advanced Multijunction Solar Cells," Conference Record of the 2006 IEEE $4^{th}$ World Conference on Photovoltaic Energy Conversion. May 1, 2006, pp. 838-841.

European Search Report for Application No. 06024750.9 dated Oct. 26, 2015; 4 pgs.

Lewis et al., "The Crystallographic Connection of MOCVD-Grown Monolithic Cascade Subcells Via Transparent Graded Layers," *Journal of Crystal Growth*, 1984; 69:515-526.

Lewis et al., "Recent Developments in Multijunction Solar Cell Research," *Solar Cells*, 1988; 24:171-183.

Lin et al., "Preparation and Properties of Conductive Polyimide Films," *Journal of Polymer Research*, 2002; 9:189-194.

Schultz et al. "High Efficiency 1.0 eV GaInAs Bottom Solar Cell for 3-junction Monolithic Stack," Conference Record of the Twenty First IEEE Photovoltaic Specialists Conference May 21-25, 1990, Kissimmee, Florida. New York: The Institute of Electrical and Electronics Engineers, Inc., pp. 148-152.

Stan et al., "Recent Advances in the Performance of Multi-Junction Space Solar Cells," 22nd European Photovoltaic Solar Energy Conference, Sep. 3-7, 2007, Milan, Italy; pp. 101-105.

Wanlass et al., "Lattice Mismatched Approaches for High Performance, III-V Photovoltaic Energy Converters," Conference Proceedings of the $31^{st}$ IEEE Photovoltaic Specialists Conference, Jan. 3-7, 2005 ; pp. 530-535.

Wanlass et al., "Monolithic, Ultra-Thin GaInP/GaAs/GaInAs Tandem Solar Cells," 2006 IEEE $4^{th}$ World Conference on Photovoltaic Energy Conversion, May 7-12, 2006, Waikoloa, HI; 729-732.

\* cited by examiner

FABRICATION OF SOLAR CELLS WITH ELECTRICALLY CONDUCTIVE POLYIMIDE ADHESIVE

REFERENCE TO RELATED APPLICATIONS

This application is a continuation-in-part of U.S. patent application Ser. No. 13/961,354, filed Aug. 7, 2013, which is herein incorporated by reference in its entirety.

This application is related to U.S. patent application Ser. No. 13/831,406, filed Mar. 14, 2013, which is herein incorporated by reference in its entirety.

GOVERNMENT RIGHTS STATEMENT

This invention was made with government support under Contract No. 11-C-0585 awarded by the National Reconnaissance Office (NRO). The Government has certain rights in the invention.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Some embodiments of such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 44%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Typical III-V compound semiconductor solar cells are fabricated on a semiconductor wafer in vertical, multijunction structures. The individual solar cells or wafers are then disposed in horizontal arrays, with the individual solar cells connected together in an electrical series and/or parallel circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties, particularly relating to the most appropriate choice of materials and fabrication steps.

SUMMARY OF THE INVENTION

Briefly, and in general terms, the present disclosure provides a method of manufacturing a solar cell comprising: providing a semiconductor growth substrate; depositing on said growth substrate a sequence of layers of semiconductor material forming a solar cell; applying a metal contact layer over said sequence of layers; and affixing the surface of a permanent supporting substrate composed of a carbon fiber reinforced polymer utilizing a conductive polyimide binding resin directly over said metal contact layer and permanently bonding it thereto by a thermocompressive technique.

In another embodiment, the present disclosure provides a method of manufacturing a solar cell comprising: providing a semiconductor growth substrate; depositing on said growth substrate a sequence of layers of semiconductor material forming an inverted metamorphic multijunction solar cell; applying a metal contact layer over said sequence of layers; affixing the surface of a permanent supporting substrate composed of a carbon fiber reinforced polymer utilizing a conductive polyimide binding resin directly over said metal contact layer and permanently bonding it thereto by a thermocompressive technique using a press for directing pressure and heat; and removing the semiconductor growth substrate.

In another embodiment, the present disclosure provides a metamorphic multijunction solar cell comprising: a permanent supporting substrate composed of a carbon fiber reinforced polymer utilizing a conductive polyimide binding resin; a metal contact layer bonded to the permanent supporting substrate with a polyimide adhesive; a sequence of layers of semiconductor material forming a metamorphic multijunction solar cell directly adjacent the metal contact layer; a cover glass adjacent the sequence of layers of semiconductor material forming the metamorphic multijunction solar cell.

BRIEF DESCRIPTION OF THE DRAWING

The invention will be better and more fully appreciated by reference to the following detailed description when considered in conjunction with the accompanying drawings, wherein.

DESCRIPTION OF ILLUSTRATIVE EMBODIMENTS

Figure 1:
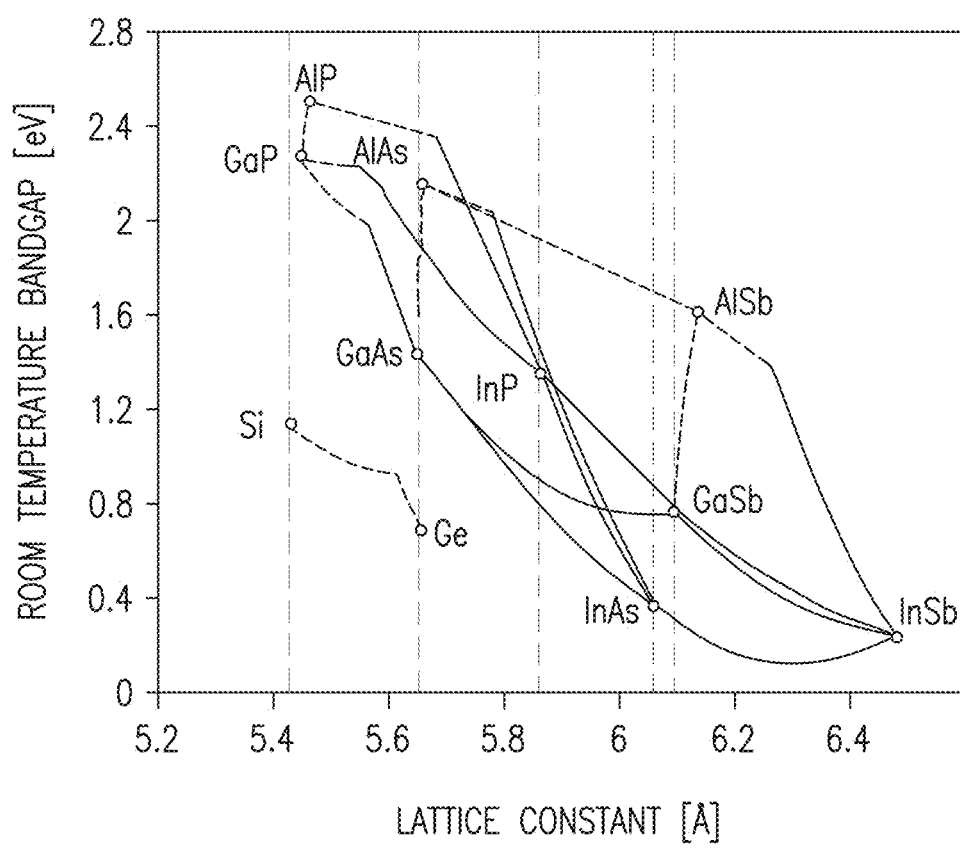
FIG. 1 is a graph representing the bandgap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are initially grown epitaxially directly on a semiconductor growth substrate, such as for example GaAs or Ge, and such subcells are consequently lattice-matched to such substrate. One or more lower band gap middle subcells (i.e. with band gaps in the range of 1.2 to 1.8 eV) can then be grown on the high band gap sub cells.

At least one lower subcell is formed over the middle subcell such that the at least one lower subcell is substantially lattice-mismatched with respect to the growth substrate and such that the at least one lower subcell has a third lower band gap (i.e., a band gap in the range of 0.7 to 1.2 eV). A second (e.g., surrogate) substrate or support structure is then attached or provided over the "bottom" or substantially lattice-mismatched lower subcell, and the growth semiconductor substrate is subsequently removed. (The growth substrate may then subsequently be re-used for the growth of second and subsequent solar cells).

A variety of different features and aspects of inverted metamorphic multijunction solar cells are disclosed in the related applications noted above. Some or all of such features may be included in the structures and processes associated with the solar cells of the present invention. Neither, some or all of such aspects may be included in the structures and processes associated with the semiconductor devices and/or solar cells of the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

It should be apparent to one skilled in the art, that the inclusion of additional semiconductor layers within the cell with similar or additional functions and properties is also within the scope of the present invention.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), or other vapor deposition methods for the reverse growth may enable the layers in the monolithic semiconductor structure forming the cell to be grown with the required thickness, elemental composition, dopant concentration and grading and conductivity type.

Figure 2:
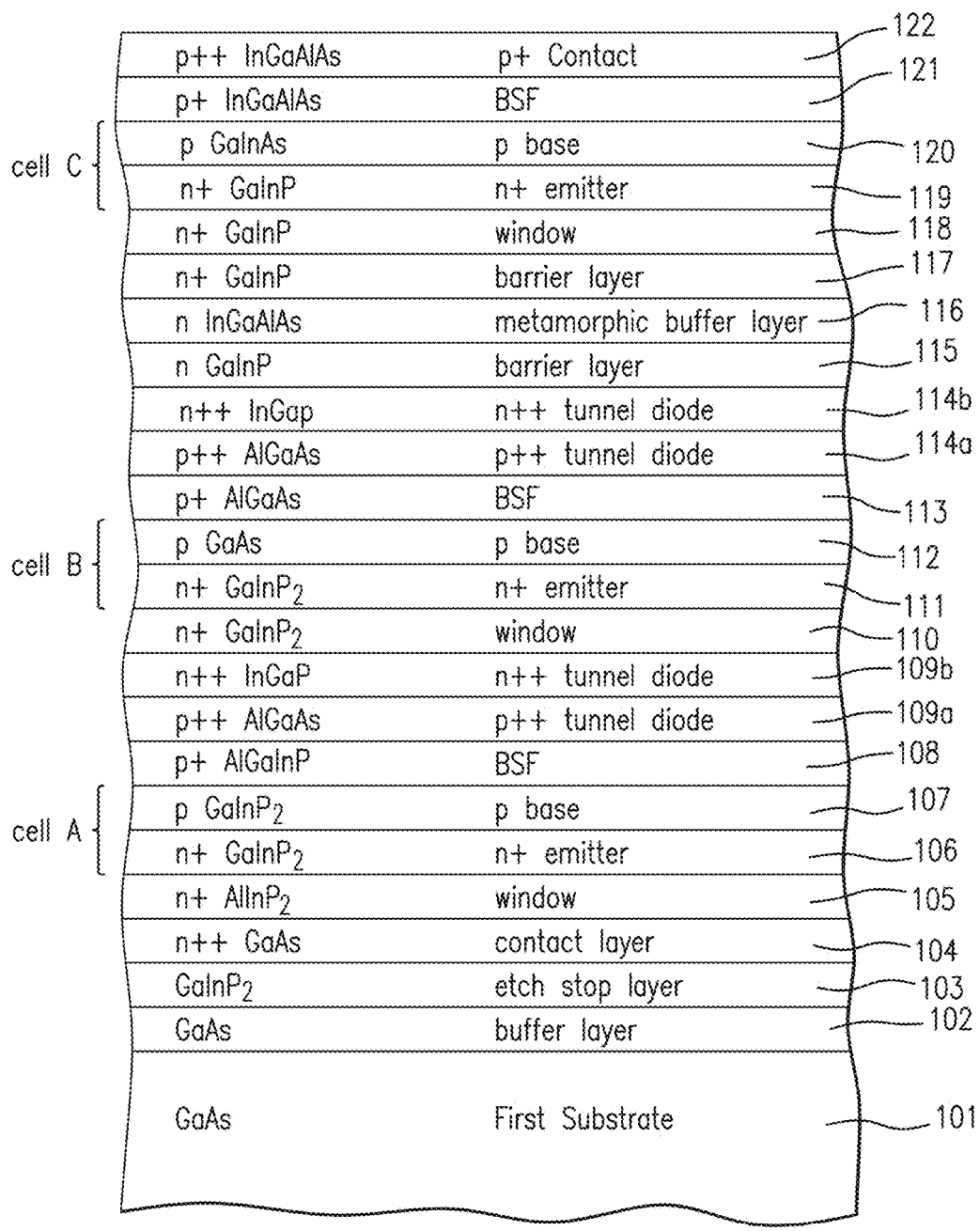
FIG. 2 is a cross-sectional view of the solar cell of the invention after the deposition of semiconductor layers on the first substrate.

FIG. 2 depicts the multijunction solar cell according to the present invention after the sequential formation of the three subcells A, B and C on a GaAs first growth substrate. More particularly, there is shown a first substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. Patent Application Pub. No. 2009/0229662 A1 (Stan et al.). Other alternative growth substrates, such as described in U.S. Pat. No. 7,785,989 B2 (Sharps et al.), may be used as well.

In the case of a Ge substrate, a nucleation layer (not shown) is deposited directly on the first substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the first growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In some embodiments, the first solar subcell can be composed of an GaInP, GaAs, GaInAs, GaAsSb, or GaInAsN emitter region 106 and an GaAs, GaInAs, GaAsSb, or GaInAsN base region 107. In a preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, a BSF layer 108 reduces recombination loss at the backside of the solar subcell A and thereby reduces the recombination in the base.

On top of the BSF layer 108 is deposited a sequence of heavily doped p-type and n-type layers 109a and 109b that forms a tunnel diode, i.e. an ohmic circuit element that connects subcell A to subcell B. Layer 109a is preferably composed of p++ AlGaAs, and layer 109b is preferably composed of n++ InGaP.

On top of the tunnel diode layers 109 a window layer 110 is deposited, preferably n+ InGaP. The advantage of utilizing InGaP as the material constituent of the window layer 110 is that it has an index of refraction that closely matches the adjacent emitter layer 111, as more fully described in U.S. Patent Application Pub. No. 2009/0272430 A1 (Cornfeld et al.). More generally, the window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region.

In previously disclosed implementations of an inverted metamorphic solar cell, the middle cell was a homostructure. In some embodiments of the present invention, similarly to the structure disclosed in U.S. Patent Application Pub. No. 2009/0078310 A1 (Stan et al.), the middle subcell becomes a heterostructure with an InGaP emitter and its window is converted from InAlP to InGaP. This modification eliminated the refractive index discontinuity at the window/emitter interface of the middle sub-cell. Moreover, the window layer 110 is preferably doped three times that of the emitter 111 to move the Fermi level up closer to the conduction band and therefore create band bending at the window/emitter interface which results in constraining the minority carriers to the emitter layer.

In one of the embodiments of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the emitters of middle subcell B nor the bottom subcell C will be exposed to absorbable radiation. Substantially all of the photons representing absorbable radiation will be absorbed in the bases of cells B and C, which have narrower band gaps than the respective emitters. In summary, the advantages of the embodiments using heterojunction subcells are: (i) the short wavelength response for both subcells are improved, and (ii) the bulk of the radiation is more effectively absorbed and collected in the narrower band gap base. The overall effect will be to increase the short circuit current $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a is preferably composed of p++ AlGaAs, and layer 114b is preferably composed of n++ InGaP.

In some embodiments, barrier layer 115, preferably composed of n-type InGa(Al)P, is deposited over the tunnel diode 114a/114b, to a thickness of about 1.0 micron. Such barrier layer is intended to prevent threading dislocations from propagating, either opposite to the direction of growth into the middle and top subcells A and B, or in the direction of growth into the bottom subcell C, and is more particularly described in copending U.S. Patent Application Pub. No. 2009/0078309 A1 (Cornfeld et al.).

A metamorphic layer (or graded interlayer) 116 is deposited over the barrier layer 115 using a surfactant. Layer 116 is referred to as a graded interlayer since in some embodiments it is preferably a compositionally step-graded series of InGaAlAs layers, preferably with monotonically changing lattice constant in each step, so as to achieve a gradual transition in lattice constant in the semiconductor structure from the lattice constant of subcell B to the lattice constant of subcell C while minimizing threading dislocations from occurring. In some embodiments, the band gap of layer 116 is constant throughout its thickness, preferably approximately equal to 1.5 eV, or otherwise consistent with a value slightly greater than the base bandgap of the middle subcell B. In some embodiments, the graded interlayer may be composed of $(In_xGa_{1-x})_yAl_{1-y}As$, with $0<x<1$, $0<y<1$, and the values of x and y selected for each respective layer such that the band gap of the entire interlayer remains constant at approximately 1.50 eV or other appropriate band gap over its thickness.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the graded interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In one of the preferred embodiments of the present invention, the layer 116 is composed of a plurality of layers of InGaAlAs, with monotonically changing lattice constant, each layer having the same bandgap, approximately 1.5 eV.

The advantage of utilizing a constant bandgap material such as InGaAlAs over a phosphide based material is that arsenide-based semiconductor material is much easier to process in standard commercial MOCVD reactors, compared to phosphide materials, while the small amount of aluminum provides a bandgap that assures radiation transparency of the metamorphic layers.

Although one of the preferred embodiments of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a bandgap energy greater than that of the second solar cell.

Although one embodiment of the present disclosure utilizes a plurality of layers of AlGaInAs for the metamorphic layer 116 for reasons of manufacturability and radiation transparency, other embodiments of the present disclosure may utilize different material systems to achieve a change in lattice constant from subcell B to subcell C. Other embodiments of the present disclosure may utilize continuously graded, as opposed to step graded, materials. More generally, the graded interlayer may be composed of any of the As, N, Sb based III-V compound semiconductors subject to the constraints of having the in-plane lattice parameter greater or equal to that of the second solar subcell and less than or equal to that of the third solar subcell, and having a band gap energy greater than that of the third solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of subcell C are deposited: the n+ emitter layer 119, and the p-type base layer 120. These layers are preferably composed of n+ type InGaAs and p type InGaAs respectively, or n+ type InGaP and p type InGaAs for a heterojunction subcell, although another suitable materials consistent with lattice constant and bandgap requirements may be used as well.

A BSF layer 121, preferably composed of InGaAlAs, is then deposited on top of the cell C, the BSF layer performing the same function as the BSF layers 108 and 113.

Finally a high band gap contact layer 122, preferably composed of InGaAlAs, is deposited on the BSF layer 121.

This contact layer added to the bottom (non-illuminated) side of a lower band gap photovoltaic cell, in a single or a multijunction photovoltaic cell, can be formulated to reduce absorption of the light that passes through the cell, so that (1) an ohmic metal contact layer below (non-illuminated side) it will also act as a mirror layer, and (2) the contact layer doesn't have to be selectively etched off, to prevent absorption.

It should be apparent to one skilled in the art, that additional layer(s) may be added or deleted in the cell structure without departing from the scope of the present invention.

Figure 3:
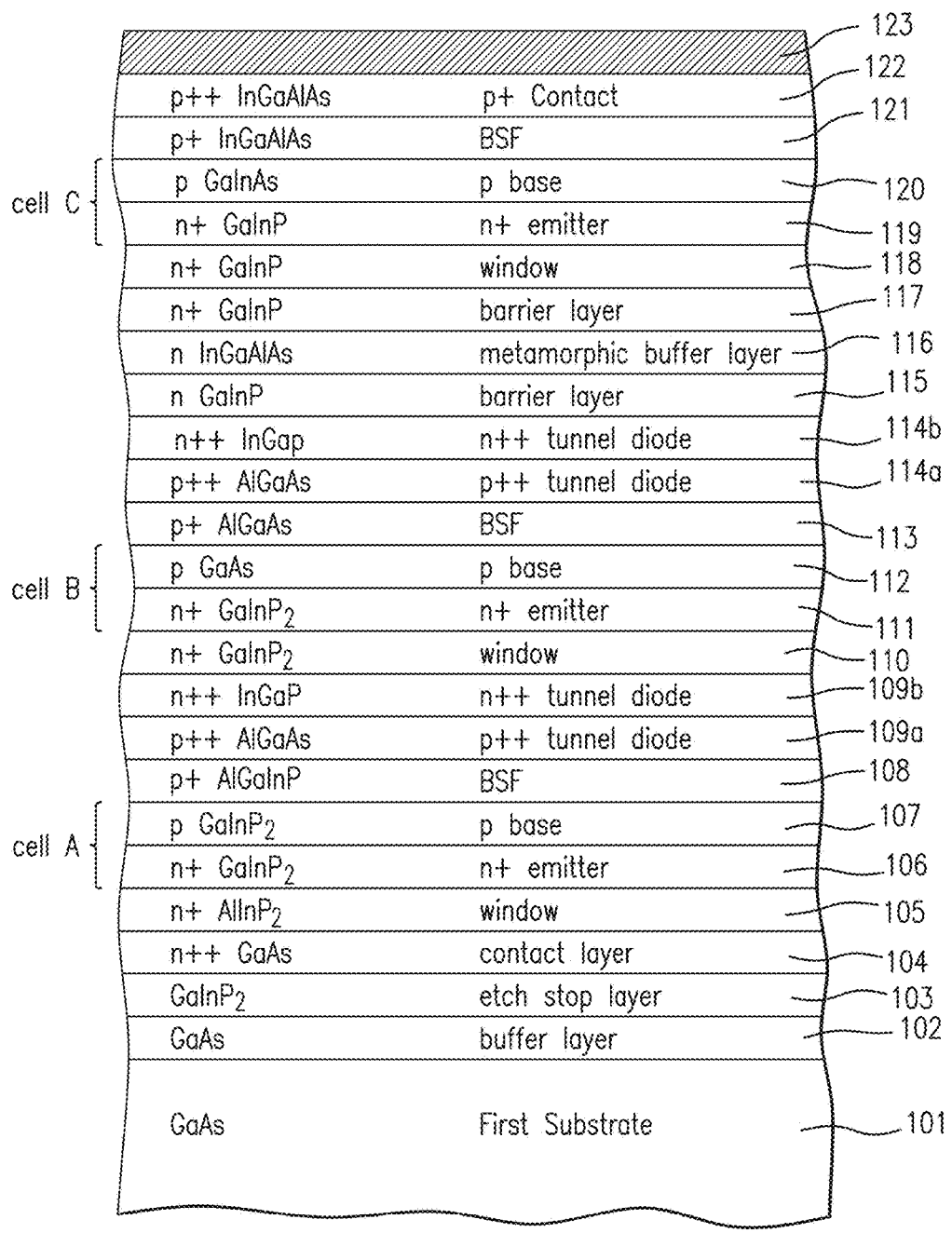
FIG. 3 is a cross-sectional view of the solar cell of FIG. 2 after the next process step.

FIG. 3 is a cross-sectional view of the solar cell of FIG. 2 after the next process step in which a metal contact layer 123 is deposited over the p+ semiconductor contact layer 122. During subsequent processing steps, the semiconductor body and its associated metal layers and bonded structures will go through various heating and cooling processes, which may put stress on the surface of the semiconductor body. Accordingly, it is desirable to closely match the coefficient of thermal expansion of the associated layers or structures to that of the semiconductor body, while still maintaining appropriate electrical conductivity and structural properties of the layers or structures. Thus, in some embodiments, the metal contact layer 123 is selected to have a coefficient of thermal expansion (CTE) substantially similar to that of the adjacent semiconductor material. In relative terms, the CTE may be within a range of 0 to 15 ppm per degree Kelvin different from that of the adjacent semiconductor material. In the case of the specific semiconductor materials described above, in absolute terms, a suitable coefficient of thermal expansion of layer 123 would range from 5 to 7 ppm per degree Kelvin. A variety of metallic compositions and multilayer structures including the element molybdenum would satisfy such criteria. In some embodiments, the layer 123 would preferably include the sequence of metal layers Ti/Au/Mo/Ag/Au, Ti/Au/Mo/Ag, or Ti/Mo/Ag, where the thickness ratios of each layer in the sequence are adjusted to minimize the CTE mismatch to GaAs. Other suitable sequences and material compositions may be used in lieu of those disclosed above.

More generally, in other embodiments, the metal contact layer may be selected to have a coefficient of thermal expansion that has a value less than 15 ppm per degree Kelvin.

In some embodiments, the metal contact layer may have a coefficient of thermal expansion that has a value within 50% of the coefficient of thermal expansion of the adjacent semiconductor material.

In some embodiments, the metal contact layer may have a coefficient of thermal expansion that has a value within 10% of the coefficient of thermal expansion of the adjacent semiconductor material.

In some embodiments, the metal contact scheme chosen is one that has a planar interface with the semiconductor, after heat treatment to activate the ohmic contact. This is done so that (i) a dielectric layer separating the metal from the semiconductor doesn't have to be deposited and selectively etched in the metal contact areas; and (ii) the contact layer is specularly reflective over the wavelength range of interest.

Figure 4:
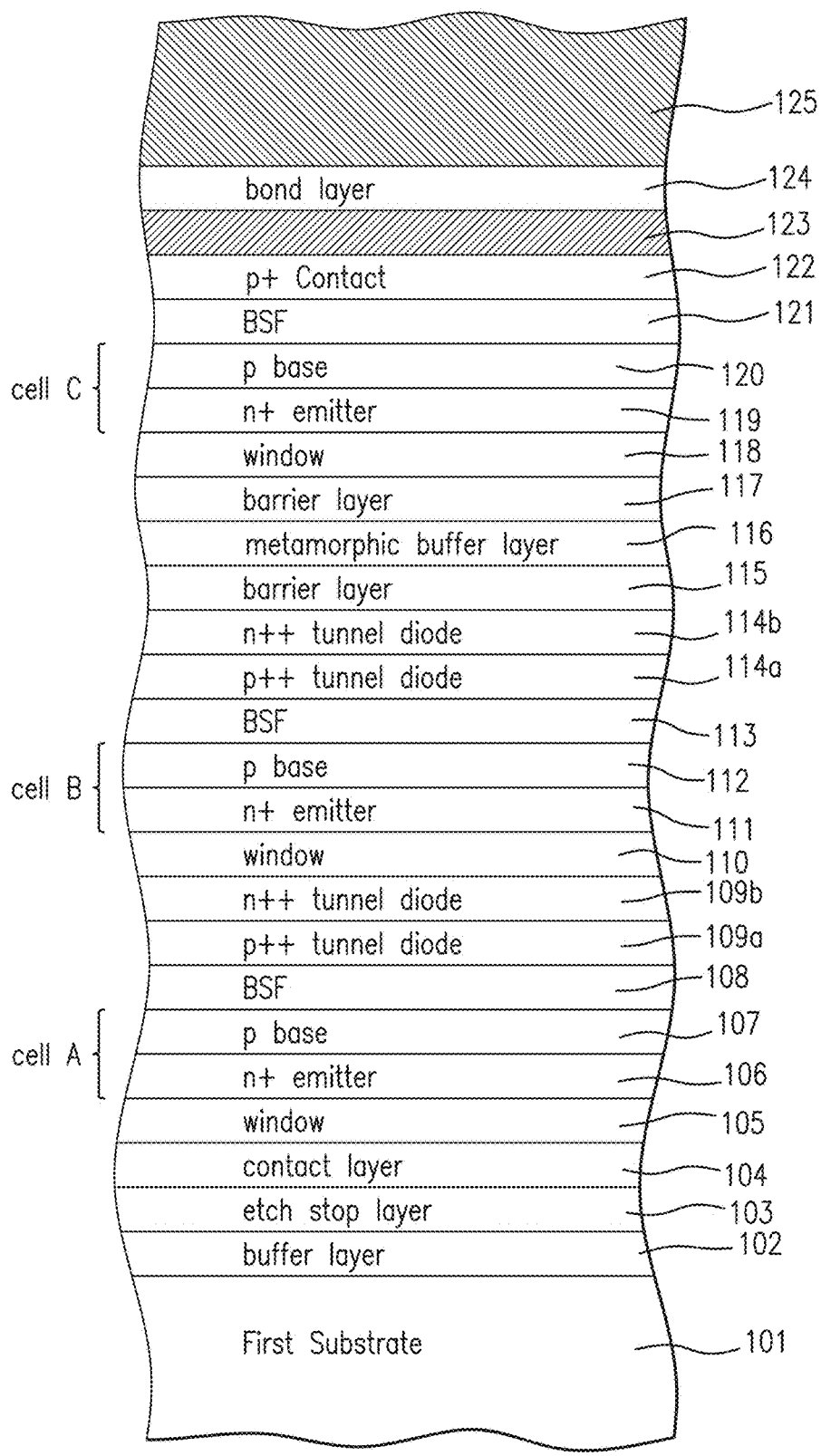
FIG. 4 is a cross-sectional view of the solar cell of FIG. 3 after the next process step in which a permanent supporting substrate is attached.

FIG. 4 is a cross-sectional view of the solar cell of FIG. 3 after the next process step in which a permanent supporting substrate 125 composed of a carbon composite sheet (e.g., carbon fiber reinforced polymer) is attached to the top surface of the metal contact layer 123 using conductive polyimide adhesive bonding layer 124. In some embodiments, the conductive polyimide adhesive bonding layer 124 can be a permanent adhesive for permanently bonding the permanent supporting substrate 125 to the metal contact layer 123. A "permanent adhesive" as used herein, is an adhesive in which the permanently bonded layers cannot be readily separated upon treatment of the permanent adhesive with a solvent under typical processing conditions for separation of temporarily bonded layers without damaging the semiconductor material. In contrast, a "temporary adhesive" as used herein is an adhesive in which the temporarily bonded layers can be readily separated upon treatment of the temporary adhesive with an organic solvent under conditions that do not damage the semiconductor material. Such conditions typically soften or dissolve the temporary adhesive.

In some embodiments, the permanent supporting substrate 125 may be a rigid substrate, such as an aluminum honeycomb substrate with carbon composite face sheet, or it may be a flexible substrate, such as a polymide film. In some embodiments, a plurality of layers of carbon composite sheets can be embedded in a matrix of cyanate ester adhesive. A polyimide can then be put on top and the whole stack co-cured.

In some embodiments, the conductive polyimide adhesive includes a polyimide resin and carbon black particles. The conductive polyimide adhesive can be prepared by mixing an appropriate amount of carbon black with a polyimide resin. The amount of carbon black that is added can be varied such that the cured conductive polyimide adhesive has the desired resistivity. For some applications, a cured conductive polyimide adhesive having a resistivity of from 100 Ω-cm to 3000 Ω-cm can be utilized. The lower limit is controlled primarily by the adhesive properties of the film. The film adhesive strength is inversely proportional to the amount of carbon black. So one is trading electrical conductivity for adhesion.

A wide variety of polyimide resins can be used including, for example, those available from HD MicroSystems (Parlin, N.J.) (e.g., an adhesive available under the trade designation HD-3007 Polyimide Adhesive).

A wide variety of carbon black particles can be used depending on the physical, chemical, and electrical properties desired. In some embodiments, the carbon black particles have a size of less than or equal to 5 micrometers. Optionally, the conductive polyimide adhesive can be filtered to remove carbon black particles having a size greater than 5 micrometers. Conductive polyimide adhesives having carbon black particles less than or equal to 5 micrometers can be especially useful for applications that include small features such as bond lines. The particle size should be kept below the intended bond line thickness so as to not disrupt the polyimide film.

In some embodiments, the conductive polyimide adhesive includes a polyimide resin and silver flakes. For example, an electrically conductive polyimide adhesive available from Polymere Technologien (Waldbronn, Germany) under the trade designation POLYTEC EC P-280 is believed to contain silver flakes.

In some embodiments, the conductive polyimide adhesive bonding layer 124 is deposited over a surface of the permanent supporting substrate 125. In some embodiments, the conductive polyimide adhesive bonding layer 124 can be applied to a surface of the permanent supporting substrate 125 using spin coating to prepare a layer of the desired thickness (e.g., 10 micrometers or less).

In some embodiments, the conductive polyimide adhesive layer on the permanent supporting substrate is cured at a temperature of from 250° C. to 350° C. Optionally and depending on the specific polyimide resin utilized, a soft bake (e.g., 120° C.) of the conductive polyimide adhesive in air may be utilized prior to curing.

The conductive polyimide adhesive bonding layer 124 is then placed adjacent to the metal contact layer 123, so that the permanent supporting substrate 125 is bonded to and adheres to the semiconductor structure. For example, a conventional wafer bonder can be used with appropriate bonding conditions (e.g., 5 kN at 300° C. for 30 minutes).

In some embodiments, the permanent supporting substrate 125 having an adhesive polyimide layer 124 bonded thereto is attached to the solar cell by a thermocompressive technique. Representative thermocompressive techniques include the use some form of press for directing pressure and heat, via conduction or convection, to the device. The step of adjoining the cured adhesive polyimide layer 124 surface and the permanent supporting substrate 125 to the surface of the sequence of layers of semiconductor material forming the solar cell can be performed at a temperature of, for example, about 300 degrees C.

Figure 5:
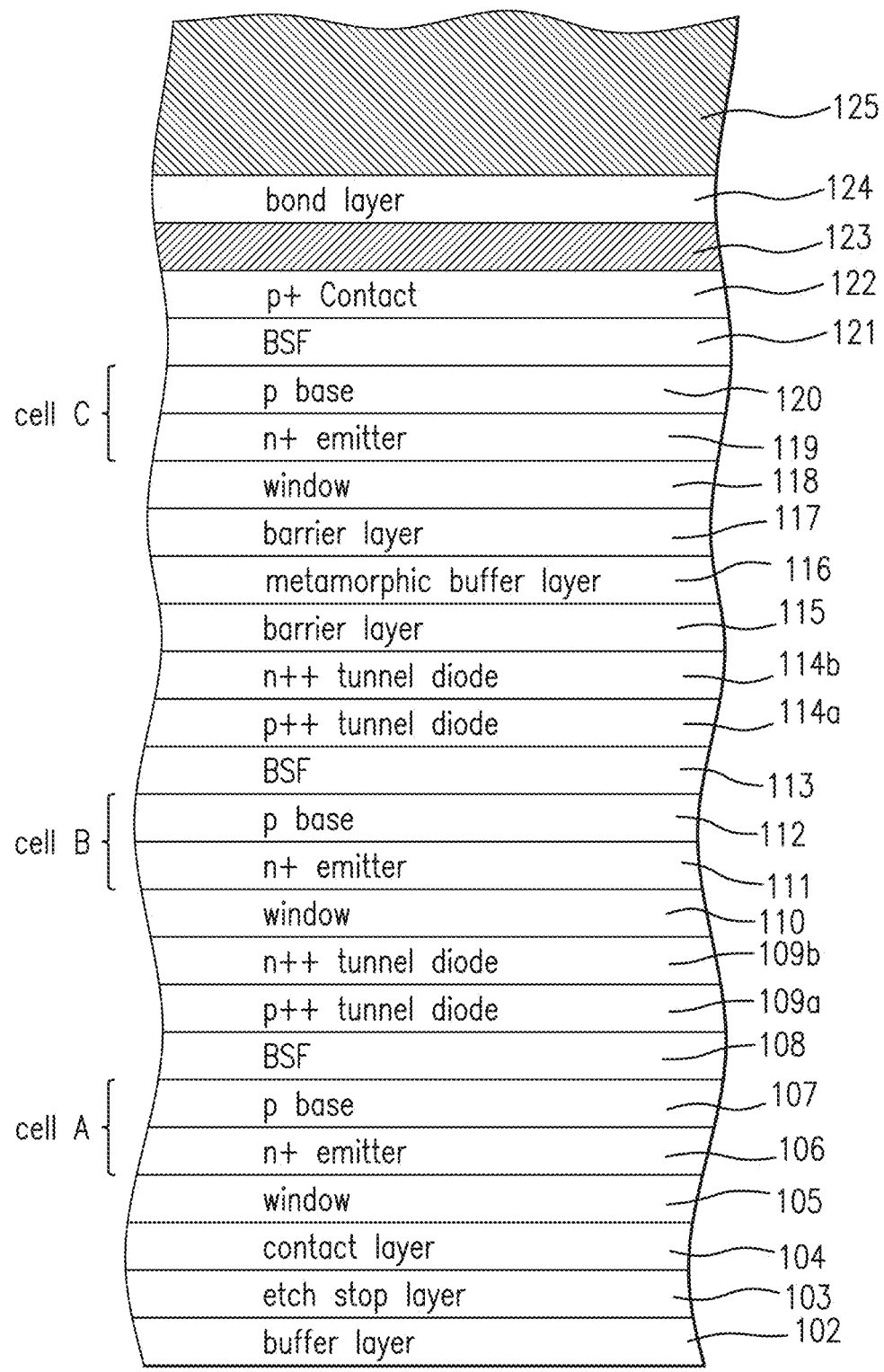
FIG. 5 is a cross-sectional view of the solar cell of FIG. 4 after the next process step in which the first substrate is removed.

FIG. 5 is a cross-sectional view of the solar cell of FIG. 4 after the next process step in which the first growth substrate 101 is removed. In some embodiments, the first substrate 101 may be removed by a sequence of lapping, grinding and/or etching steps in which the first substrate 101, and the buffer layer 103 are removed. The choice of a particular etchant is growth substrate dependent. In other embodiments, the first substrate may be removed by an epitaxial lift-off process such as described in U.S. Patent Application Pub. No. 2010/0203730 A1 (Cornfeld et al.), hereby incorporated by reference.

Figure 6:
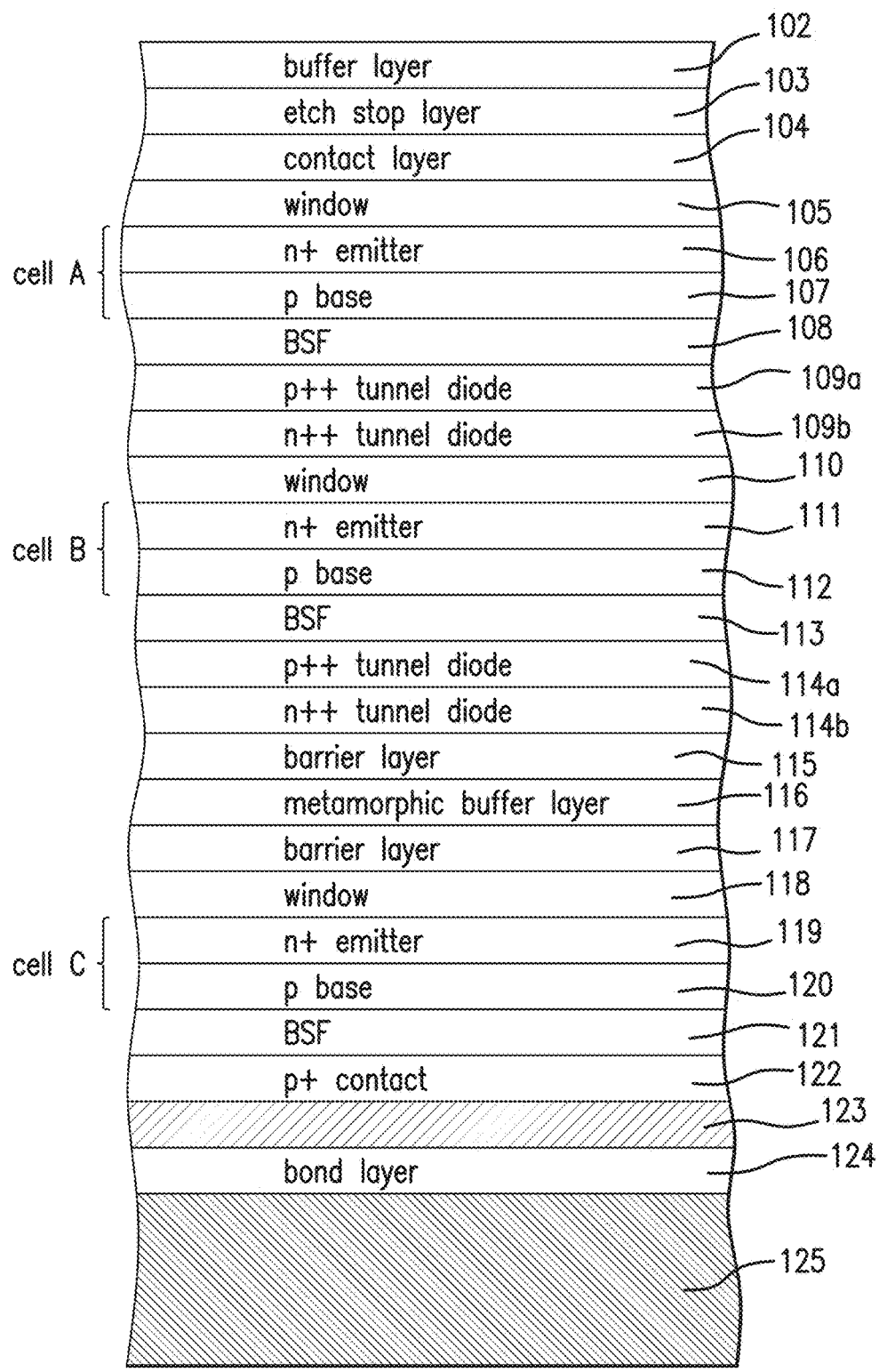
FIG. 6 is another cross-sectional view of the solar cell of FIG. 5 with the permanent supporting substrate on the bottom of the Figure.

FIG. 6 is a cross-sectional view of the solar cell of FIG. 5 with the orientation with the permanent supporting substrate 125 being at the bottom of the Figure. Subsequent Figures in this application will assume such orientation.

Figure 7:
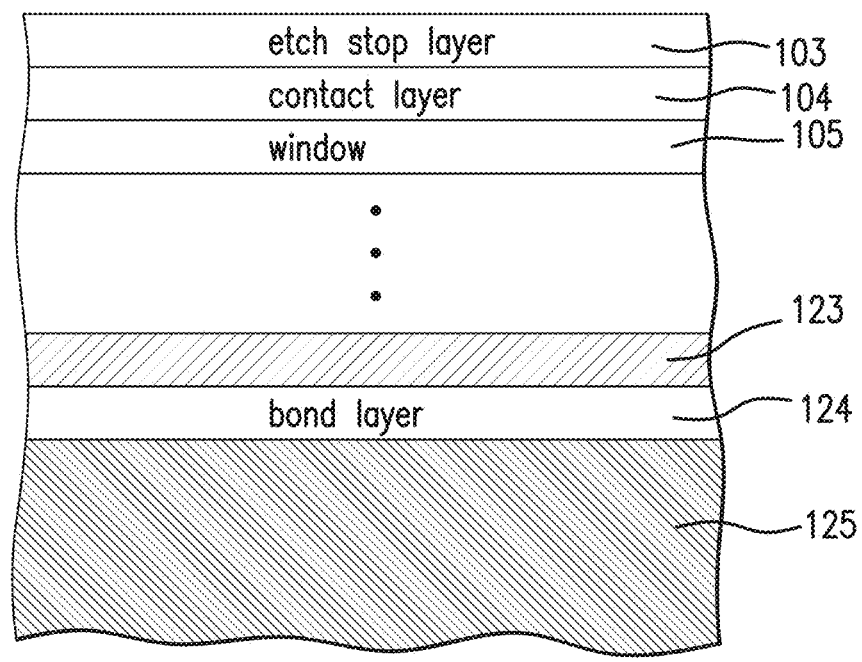
FIG. 7 is a simplified cross-sectional view of the solar cell of FIG. 6 after the next process step.

FIG. 7 is a simplified cross-sectional view of the solar cell of FIG. 6 depicting just a few of the top layers and lower layers over the permanent supporting substrate 125, with the orientation with the permanent supporting substrate 125 being at the bottom of the Figure. Subsequent Figures in this application will assume such orientation.

Figure 8:
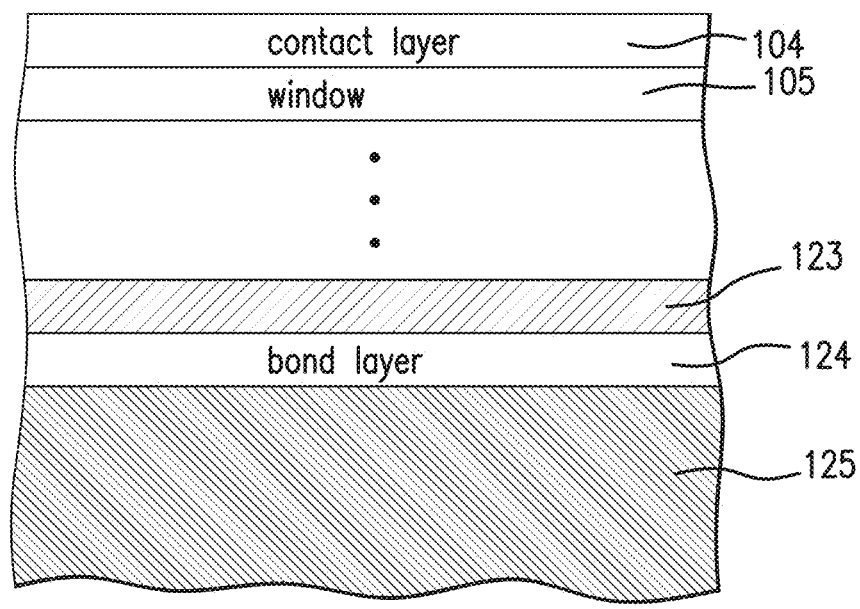
FIG. 8 is a cross-sectional view of the solar cell of FIG. 7 after the next process step.

FIG. 8 is a cross-sectional view of the solar cell of FIG. 7 after the next process step in which the etch stop layer 103 is removed by a HCl/H$_2$O solution.

Figure 9:
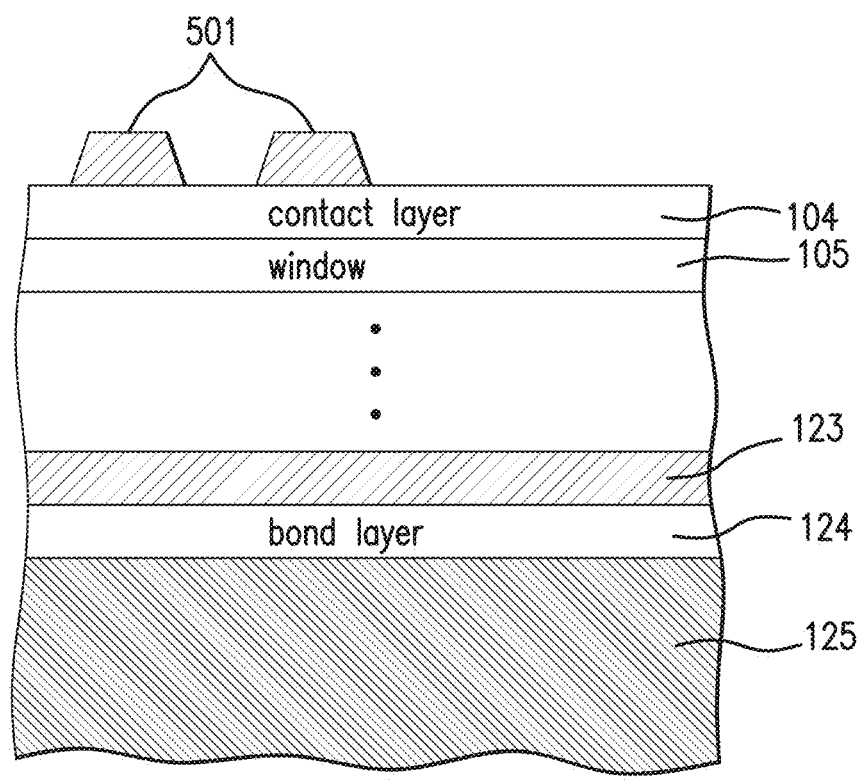
FIG. 9 is a cross-sectional view of the solar cell of FIG. 8 after the next process step.

FIG. 9 is a cross-sectional view of the solar cell of FIG. 8 after the next sequence of process steps in which a photoresist mask (not shown) is placed over the contact layer 104 to form the grid lines 501. As will be described in greater detail below, the grid lines 501 can be deposited via evaporation and lithographically patterned and deposited over the contact layer 104. The mask can be subsequently lifted off to form the finished metal grid lines 501 as depicted in the Figures.

As more fully described in U.S. Patent Application Pub. No. 2010/0012175 A1 (Varghese et al.), hereby incorporated by reference, the grid lines 501 are preferably composed of the sequence of layers Pd/Ge/Ti/Pd/Au, although other suitable sequences and materials may be used as well.

Figure 10:
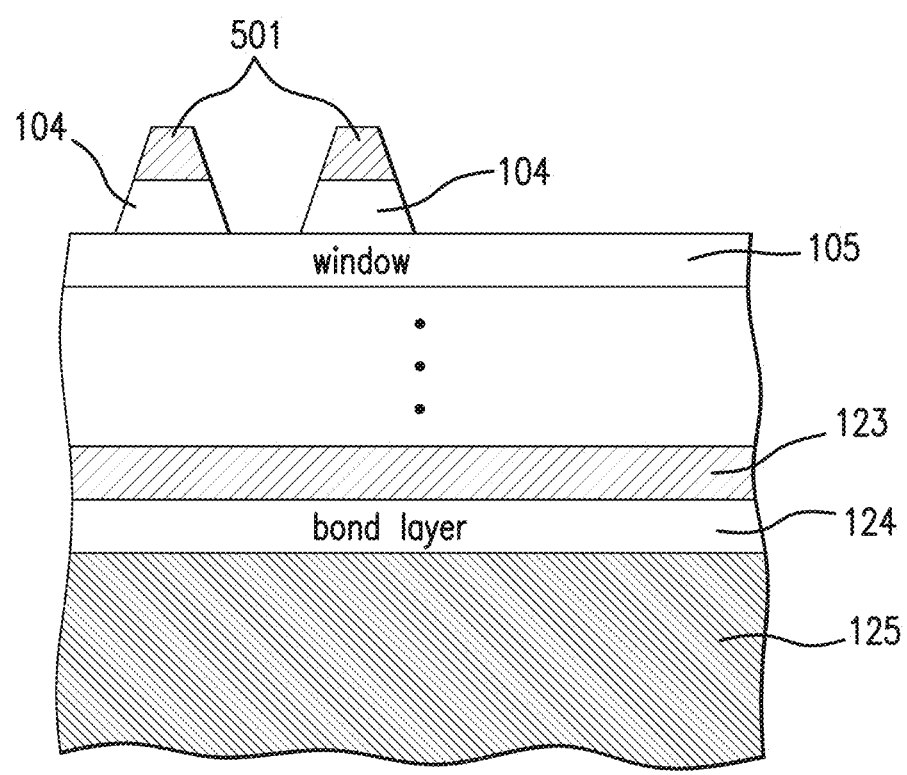
FIG. 10 is a cross-sectional view of the solar cell of FIG. 9 after the next process step.

FIG. 10 is a cross-sectional view of the solar cell of FIG. 9 after the next process step in which the grid lines are used as a mask to etch down the surface to the window layer 105 using a citric acid/peroxide etching mixture.

In some embodiments, a cover glass may be attached to the top of the solar cell by an adhesive. The cover glass is typically about 4 mils thick. Although the use of a cover glass is desirable for many environmental conditions and applications, it is not necessary for all implementations, and additional layers or structures may also be utilized for providing additional support or environmental protection to the solar cell.

It will be understood that each of the elements described above, or two or more together, also may find a useful application in other types of constructions differing from the types of constructions described above.

Although some of the embodiments of the present invention utilizes a vertical stack of three subcells, the present invention can apply to stacks with fewer or greater number of subcells, i.e. two junction cells, four junction cells, five junction cells, etc. as more particularly described in U.S. Pat. No. 8,236,600 (Cornfeld). In the case of four or more junction cells, the use of more than one metamorphic grading interlayer may also be utilized, as more particularly described in U.S. Patent Application Pub. No. 2010/0122724 A1 (Cornfeld et al.).

In addition, although in some embodiments the solar cell is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, embodiments of the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. Patent Application Pub. No. 2009/0078310 A1 (Stan et al.), the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some embodiments, a thin so-called "intrinsic layer" may be placed between the emitter layer and base layer of some subcells, with the same or different composition from either the emitter or the base layer. The intrinsic layer may function to suppress minority-carrier recombination in the space-charge region by minimizing interdiffusion of the n-type and p-type dopants on either side of the junction. Similarly, either the base layer or the emitter layer may also be intrinsic or not-intentionally-doped ("NID") over part or all of its thickness. Some such configurations are more particularly described in U.S. Patent Application Pub. No. 2009/0272438 A1 (Cornfeld).

The composition of the window or BSF layers may utilize other semiconductor compounds, subject to lattice constant and band gap requirements, and in some embodiments may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

Although the invention has been illustrated and described as embodied in an inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as, thermophotovoltaic (TPV) cells, photodetectors and light-emitting diodes (LEDs) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

The invention claimed is:

1. A method of manufacturing a solar cell comprising:
providing a semiconductor growth substrate;
depositing on said growth substrate a sequence of layers of semiconductor material forming a solar cell, wherein said step of depositing the sequence of layers of semiconductor material includes forming a first solar subcell on said substrate having a first band gap; forming a second solar subcell over said first subcell having a second band gap smaller than said first band gap; forming a grading interlayer over said second solar subcell having a third band gap larger than said second band gap; and forming a third solar subcell having a fourth band gap smaller than said second band gap such that said third subcell is lattice mismatched with respect to said second subcell;
applying a metal contact layer over said sequence of layers; and
affixing the surface of a permanent supporting substrate composed of a carbon fiber reinforced polymer utilizing a conductive polyimide binding resin directly over said metal contact layer and permanently bonding it thereto by a thermocompressive technique.

2. A method as defined in claim 1, further comprising removing the semiconductor growth substrate subsequent to affixing the surface of a permanent supporting substrate directly over said metal contact layer and permanently bonding thereto.

3. A method as defined in claim 2, wherein the semiconductor substrate is removed after the permanent supporting substrate has been attached by grinding, etching, or epitaxial lift-off.

4. A method as defined in claim 1, further comprising forming grid electrodes on the surface of the layers of semiconductor material to form a top surface of the solar cell.

5. A method as defined in claim 4, further comprising attaching a cover glass to the top surface of the solar cell.

6. A method as defined in claim 1, wherein said growth substrate is composed of GaAs.

7. A method as defined in claim 1, wherein said first solar subcell is composed of an InGa(Al)P emitter region and an InGa(Al)P base region.

8. A method as defined in claim 1, wherein said grading interlayer is composed of $(In_xGa_{1-x})_y Al_{1-y}As$, wherein $0<x<1$ and $0<y<1$ with x and y selected such that the band gap of each interlayer remains constant throughout its thickness.

9. A method as defined in claim 1, wherein said first solar subcell is composed of an GaInP, GaAs, GaInAs, GaAsSb, or GaInAsN emitter region and an GaAs, GaInAs, GaAsSb, or GaInAsN base region, and the second solar subcell is composed of an InGaP emitter layer and a GaAs or GaInAs base layer.

10. The method as defined in claim 1, wherein the first solar subcell is composed of an InGaAs base and emitter layer, or an InGaAs base layer and an InGaP emitter layer.

11. The method as defined in claim 1, wherein the grading interlayer is compositionally graded to lattice match the second solar subcell on one side and the first solar subcell on the other side, and is composed of $(In_xGa_{1-x})_y Al_{1-y}As$, wherein $0<x<1$ and $0<y<1$ with x and y selected such that the band gap of the interlayer remains constant throughout its thickness and greater than said second band gap.

12. A method as defined in claim 1, wherein the step of affixing the conductive polyimide binding resin to the permanent supporting substrate is performed at a curing temperature above 350 degrees C.

13. A method of manufacturing a solar cell comprising:
providing a semiconductor growth substrate;
depositing on said growth substrate a sequence of layers of semiconductor material forming an inverted metamorphic multijunction solar cell, wherein said step of depositing the sequence of layers of semiconductor material includes forming a first solar subcell on said substrate having a first band gap; forming a second solar subcell over said first subcell having a second band gap smaller than said first band gap; forming a grading interlayer over said second solar subcell having a third band gap larger than said second band gap; and forming a third solar subcell having a fourth band gap smaller than said second band gap such that said third subcell is lattice mismatched with respect to said second subcell;
applying a metal contact layer over said sequence of layers;
affixing the surface of a permanent supporting substrate composed of a carbon fiber reinforced polymer utilizing a conductive polyimide binding resin directly over said metal contact layer and permanently bonding it thereto by a thermocompressive technique using a press for directing pressure and heat; and
removing the semiconductor growth substrate.

14. A method as defined in claim 13, further comprising attaching a cover glass to the top surface of the solar cell.

15. A method as defined in claim 13, wherein the step of affixing the conductive polyimide binding resin to the permanent supporting substrate is performed at a curing temperature above 350 degrees C.

16. A method as defined in claim 13, wherein the growth substrate is removed after the permanent supporting substrate has been attached by grinding, etching, or epitaxial lift-off.

17. A method as defined in claim 13, further comprising forming grid electrodes on the surface of the layers of semiconductor material to form a top surface of the solar cell.

18. A method as defined in claim 13, wherein said growth substrate is composed of GaAs.

* * * * *